United States Patent
Ma et al.

(10) Patent No.: US 11,733,286 B2
(45) Date of Patent: Aug. 22, 2023

(54) VECTOR ANALYSIS CALCULATION-BASED ARC CROSSTALK SIGNAL IDENTIFICATION METHOD

(71) Applicant: QINGDAO TOPSCOMM COMMUNICATION CO., LTD, Shandong (CN)

(72) Inventors: Yue Ma, Shandong (CN); Jianhua Wang, Shandong (CN); Zhen Liu, Shandong (CN); Ze'an Jiang, Shandong (CN); Huarong Wang, Shandong (CN)

(73) Assignee: QINGDAO TOPSCOMM COMMUNICATION CO., LTD, Shandong (CN)

( * ) Notice: Subject to any disclaimer, the term of this patent is extended or adjusted under 35 U.S.C. 154(b) by 0 days.

(21) Appl. No.: 17/784,601

(22) PCT Filed: Dec. 31, 2020

(86) PCT No.: PCT/CN2020/000333
§ 371 (c)(1),
(2) Date: Jun. 10, 2022

(87) PCT Pub. No.: WO2021/134737
PCT Pub. Date: Jul. 8, 2021

(65) Prior Publication Data
US 2023/0022120 A1    Jan. 26, 2023

(30) Foreign Application Priority Data
Jan. 2, 2020    (CN) .......................... 202010000311.3

(51) Int. Cl.
*G01R 31/08*    (2020.01)
(52) U.S. Cl.
CPC ................................. *G01R 31/088* (2013.01)

(58) Field of Classification Search
CPC .................................................... G01R 31/088
See application file for complete search history.

(56) References Cited

U.S. PATENT DOCUMENTS 5,986,860 A    11/1999 Scott
6,313,641 B1   11/2001 Brooks
(Continued)

FOREIGN PATENT DOCUMENTS

CN    208953612 U    6/2019
CN    110007197 A    7/2019
(Continued)

OTHER PUBLICATIONS

International Search Report for PCT/CN2020/000333 dated Mar. 24, 2021, ISA/CN.
(Continued)

*Primary Examiner* — Farhana A Hoque
(74) *Attorney, Agent, or Firm* — Yue (Robert) Xu; Apex Attorneys at Law, LLP (57) ABSTRACT

A vector analysis calculation-based arc crosstalk signal identification method. A new sampling circuit manner is proposed in the method, wherein a current signal is sampled on zero and live lines, and the signal is converted into two digital signals with a sampling rate of 200 MHz by means of a dual-channel ADC, and the digital signals are sent to a hardware digital signal processing unit. Five pass bands are selected to perform band-pass filtering on the two signals separately. Time-sharing processing and vector analysis are performed on the filtered signals, and the amplitude ratio and fluctuation characteristics of two resistor terminal voltages, as well as the phase difference between shunt resistor and inductor terminal voltage signals are extracted as crosstalk feature quantities. According to a zero-crossing signal, a system segments the feature quantities extracted by a hard-
(Continued)

ware processing module and sends same to a neural network for classification and determination.

7 Claims, 7 Drawing Sheets

(56) References Cited

U.S. PATENT DOCUMENTS

| | | |
|---|---|---|
| 2004/0042137 A1 | 3/2004 | Wong et al. |
| 2013/0038971 A1* | 2/2013 | Ward .................. H02H 1/0015 361/86 |
| 2013/0141112 A1 | 6/2013 | Potter et al. |
| 2016/0187386 A1* | 6/2016 | El-Damak .............. G01R 19/10 324/126 |

FOREIGN PATENT DOCUMENTS

| | | |
|---|---|---|
| CN | 110082635 A | 8/2019 |
| CN | 110542835 A | 12/2019 |

OTHER PUBLICATIONS

Chen,Yongzhi, Study on detection technology for electrical fire of arc and development of Arc Fault Detection Device, Science & Engineering (B), China Master's Theses Full-Text Databas, Feb. 15, 2017, No. 02.
Search Report dated Dec. 15, 2022 for European patent application No. 20909189.1.

\* cited by examiner

VECTOR ANALYSIS CALCULATION-BASED ARC CROSSTALK SIGNAL IDENTIFICATION METHOD

This application is the national phase of International Patent Application No. PCT/CN2020/000333, titled "VECTOR ANALYSIS CALCULATION-BASED ARC CROSSTALK SIGNAL IDENTIFICATION METHOD", filed on Dec. 31, 2020, which claims priority to Chinese Patent Application No. 202010000311.3, titled "VECTOR ANALYSIS CALCULATION-BASED ARC CROSSTALK SIGNAL IDENTIFICATION METHOD", filed on Jan. 2, 2020 with the Chinese Patent Office, both of which are incorporated herein by reference in their entireties.

FIELD

The present disclosure belongs to the field of fault arc detection, in particular to a method for identifying a crosstalk signal due to a bypass arc.

BACKGROUND

Electrical fires account for a high proportion of fire accidents in today's society, and arc faults are one of the important causes of electrical fires. Fault arcs are usually caused by aging and breakage of lines and equipment insulation, or poor electrical connections. When a fault arc occurs, the occurrence of arc may release high temperature, easily causing a fire accident. There are two types of arcs: parallel arcs and series arcs. In a case that a parallel arc occurs, an effective value of a current in a circuit generally exceeds 75 A. At present, a conventional circuit protection device can detect overcurrent fault, and then the circuit is disconnected. Therefore, series arcs are the main cause of electrical fires. In a case that a series arc occurs, due to the influence of other loads in the circuit, an effective value of a current in the circuit is slightly different from an effective value of a current in the circuit under normal conditions. In this case, the conventional circuit protection device cannot effectively detect the arc fault in the circuit, easily causing a fire accident.

In a case that a fault arc occurs, a current signal in a line is significantly distorted to contain a high-frequency component. In a case that a fault arc occurs in a bypass circuit, an arc signal may be detected by a fault arc detection device in a main circuit. Due to the high similarity between the fault arc in the bypass circuit and the fault arc in the main circuit, the fault arc in the bypass circuit is easily identified as a fault arc in the main circuit, resulting in a false tripping operation by the fault arc detection device in the main circuit. Generally, the conventional fault arc detection device is unable to distinguish between an arc and a crosstalk signal. Due to frequent false tripping operations, it is difficult for the arc detection device to be widely used and popularized, causing serious safety hazards to most electrical devices and power lines in society.

For the conventional arc detection device limited by the development of the electronic technology, the method for detecting an arc signal and identifying a crosstalk signal is single in which arc features are detected only based on waveforms of low-frequency currents, and the method is seriously disturbed by electrical load. With the accelerated development of the IC technology, the IC technology is widely used in various devices. With the improvement of the IC technology, the IC technology provides technical support for realization of various complex function algorithms. Since circuit systems based on the IC technology generally have the advantages of low power consumption, low mass production cost and strong anti-interference, the method for identifying a crosstalk signal according to the present disclosure can be realized and applied.

A crosstalk arc in a bypass circuit and an arc in a main circuit have the same features in essence, so that it is difficult to directly distinguish an arc from a crosstalk. According to the present disclosure, a new sampling circuit method is provided. In the method, voltages respectively across two sampling resistors may be obtained based on a Y-shaped circuit, and features of amplitude ratio and phase difference of the two voltages are extracted by using a vector analysis and calculation tool, timely and accurately identifying an arc in a main circuit and a crosstalk signal in a bypass circuit, avoiding a false tripping operation by an arc detection device, thereby laying a foundation for application and promotion of the arc detection device.

SUMMARY

For the problem that a device frequently performs false tripping operations due to that a bypass crosstalk signal cannot be accurately identified by a conventional arc detection method, a new sampling circuit structure is proposed according to the present disclosure. In the new sampling circuit structure is proposed according to the present disclosure, sampling is performed on a current between a live line and a neutral line respectively, two sampling signals are outputted and transmitted to a digital signal processing unit. Based on a vector analysis algorithm, a ratio of amplitudes of the two signals and a difference between phases of the two signals are extracted and then transmitted to a neural network in real time to perform classification decision to determine whether an arc signal comes from a main circuit or a bypass circuit.

Figure 2:
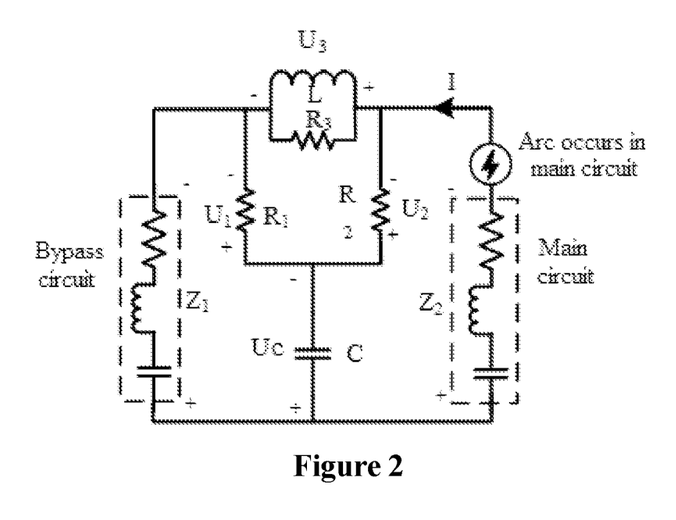
FIG. 2 shows an equivalent circuit analysis in a case that an arc occurs in a main circuit under an ideal condition.
Figure 3:
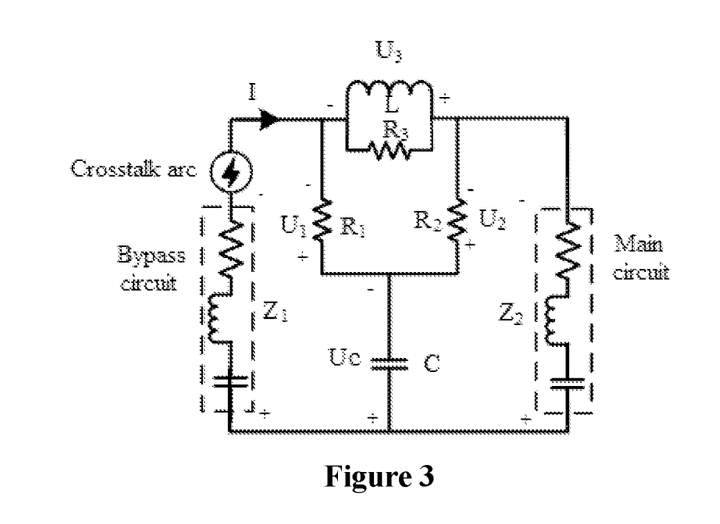
FIG. 3 shows an equivalent circuit analysis in a case that an arc occurs in a bypass circuit under an ideal condition.

Based on the principle of the present disclosure, FIG. 2 shows an equivalent circuit diagram of a sampling circuit and loads in the present disclosure in a case that an arc occurs in a main circuit, and FIG. 3 shows an equivalent circuit diagram of a sampling circuit and loads in the present disclosure in a case that a crosstalk occurs in a bypass circuit. Based on a Y-type sampling circuit, sampling is performed on a signal between a live line and a neutral line. According to a position at which sampling is performed, resistors $R_1$ and $R_2$ are determined as a main sampling resistor and a bypass sampling resistor.

FIG. 2 shows an equivalent circuit analysis in a case that an arc occurs in a main circuit under an ideal condition. Resistors $R_1$, $R_2$ and $R_3$, a capacitor c and an inductor L form the Y-shaped sampling circuit according to the present disclosure. An access load of the bypass circuit is equivalent to $Z_1$, an access load of the main circuit is equivalent to $Z_2$. An arc signal is equivalent to a high-frequency small-signal current source. A reference direction of a current of each of branches is as marked in FIG. 2. Based on a Kirchhoff's voltage and current rule, expressions for vectors $\dot{U}_1$, $\dot{U}_2$ and $\dot{U}_3$ may be derived as follows:

$$\dot{U}_1 = \frac{k_4 - k_5}{k_1 \cdot (k_3 - k_5) + k_2 \cdot (k_4 - k_3)} \cdot \dot{I}$$

$$\dot{U}_2 = \frac{k_3 - k_5}{k_1 \cdot (k_3 - k_5) + k_2 \cdot (k_4 - k_3)} \cdot \dot{I}$$

-continued $$\dot{U}_3 = \frac{k_4 - k_3}{k_1 \cdot (k_3 - k_5) + k_2 \cdot (k_4 - k_3)} \cdot \dot{I} \text{ where:} Z_c = \frac{1}{j\omega C},$$

$$Z_3 = \frac{R_3 \cdot j\omega L}{R_3 + j\omega L}, k_1 = \frac{1}{Z_3}, k_2 = -\frac{1}{R_2},$$

$$k_3 = \frac{Z_c + Z_1}{R_1} + 1, k_4 = -\frac{Z_1}{Z_3}, \text{ and } k_5 = -\frac{Z_c}{R_2}.$$

Similarly, FIG. 3 shows an equivalent analysis of a crosstalk circuit in a case that an arc occurs in a bypass circuit under an ideal condition. Expressions for vectors $\dot{U}_1$, $\dot{U}_2$ and $\dot{U}_3$ are derived as follows:

$$\dot{U}_1 = \frac{g_4 - g_3}{g_1 \cdot (g_3 - g_5) + g_2 \cdot (g_4 - g_3)} \cdot \dot{I}$$

$$\dot{U}_2 = \frac{g_4 - g_5}{g_1 \cdot (g_3 - g_5) + g_2 \cdot (g_4 - g_3)} \cdot \dot{I}$$

$$\dot{U}_3 = \frac{g_5 - g_3}{g_1 \cdot (g_3 - g_5) + g_2 \cdot (g_4 - g_3)} \cdot \dot{I} \text{ where:} Z_c = \frac{1}{j\omega C},$$

$$Z_3 = \frac{R_3 \cdot j\omega L}{R_3 + j\omega L}, g_1 = \frac{1}{Z_3}, g_2 = -\frac{1}{R_1},$$

$$g_3 = \frac{Z_c + Z_2}{R_2} + 1, g_4 = -\frac{Z_2}{Z_3}, \text{ and } g_5 = -\frac{Z_c}{R_1}.$$

Circuit parameters are configured as follows: $R_1=10\Omega$, $R_2=10\Omega$, $R_3=20\Omega$, capacitor C=20 nf. Resistive loads, inductive loads and capacitive loads are respectively connected in series to the bypass circuit and the main circuit.

$$Z_t = 300 + j \cdot \omega \cdot 10uH + \frac{1}{j \cdot \omega \cdot 20nf},$$

$$\text{and } Z_2 = 300 + j \cdot \omega \cdot 10uH + \frac{1}{j \cdot \omega \cdot 20nf}.$$

Based on the configured sampling circuit parameters, the signal in a pass band is observed. The above parameters are configured according to an embodiment of the present disclosure, and the present disclosure is not limited to the above circuit parameters. Ideally, analysis is performed on signals having different frequencies.

Figure 4:
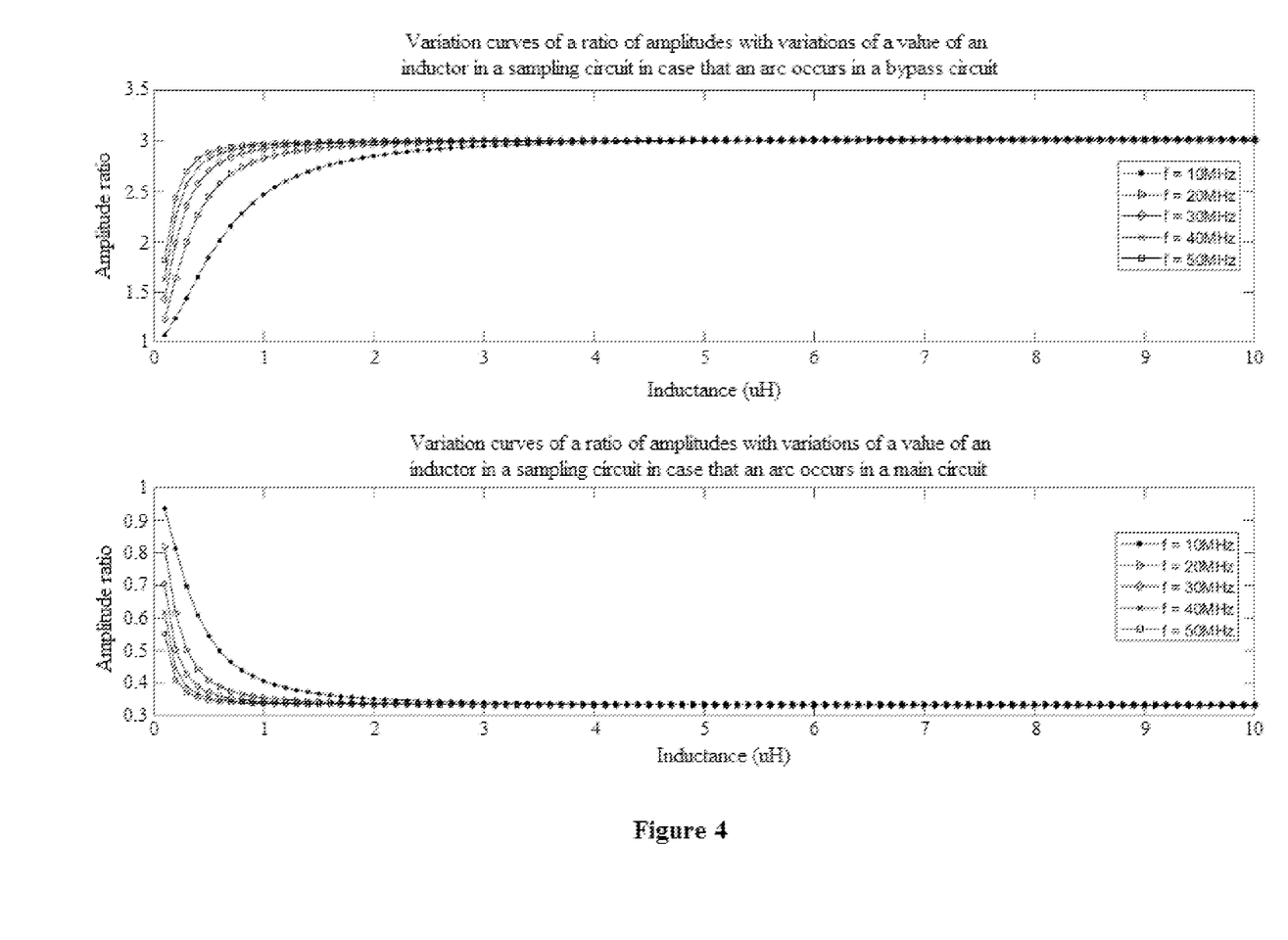
FIG. 4 shows variation curves of a ratio of an amplitude of $\dot{U}_1$ and an amplitude of $\dot{U}_2$ with variations of a value of an inductor in a sampling circuit in a case that an arc occurs in a bypass circuit and variation curves of a ratio of an amplitude of $\dot{U}_1$ and an amplitude of $\dot{U}_2$ with variations of a value of an inductor in a sampling circuit in a case that an arc occurs in a main circuit.

FIG. 4 shows variation curves of a ratio of an amplitude of $\dot{U}_1$ and an amplitude of $\dot{U}_2$ with variations of a value of an inductor in a sampling circuit in a case that an arc occurs in a bypass circuit and variation curves of a ratio of an amplitude of $\dot{U}_1$ and an amplitude of $\dot{U}_2$ with variations of a value of an inductor in a sampling circuit in a case that an arc occurs in a main circuit. Based on the circuit parameters in the above embodiments, the ratio of the amplitude of $\dot{U}_1$ and the amplitude of $\dot{U}_2$ is less than 1 in the case that the arc occurs in the main circuit, and the ratio of the amplitude of $\dot{U}_1$ and the amplitude of $\dot{U}_2$ is greater than 1 in the case that the arc occurs in the bypass circuit.

In the equivalent circuit in the case that the arc occurs in the main circuit and the equivalent circuit in the case that the crosstalk arc occurs in the bypass circuit, $\dot{U}_1$, $\dot{U}_2$ and $\dot{U}_3$ represent voltages at positions at which sampling is performed in the above cases, thus the following equations may be obtained:

in the case that the arc occurs in the main circuit:

$$|\dot{U}_1| = |\dot{U}_2| - |\dot{U}_3|$$

in the case that the arc occurs in the bypass circuit:

$$|\dot{U}_1| = |\dot{U}_2| + |\dot{U}_3|$$

Based on the above two equations, it can be seen that $$|\dot{U}_1| < |\dot{U}_2|$$

in the case that the arc occurs in the main circuit, and $$|\dot{U}_1| > |\dot{U}_2|$$

in the case that the arc occurs in the bypass circuit. The difference between amplitudes in the two cases is equal to a voltage $$|\dot{U}_3|$$

of the inductor L. Since a multi-channel narrow-band filter circuit is adopted in the present disclosure to extract multiple frequency components of two sampling signals for data analysis, a voltage of an inductive reactance (jωl) is proportional to a frequency as the amplitude changes. Different frequencies correspond to voltages having different amplitudes, so that fluctuations of amplitudes of the two resistor signals are different. In the present disclosure, absolute value operation is performed on the amplitude signals, then the two resistor signals are compared, and then an arc in the main circuit and a crosstalk arc in the bypass circuit are identified.

Figure 5:
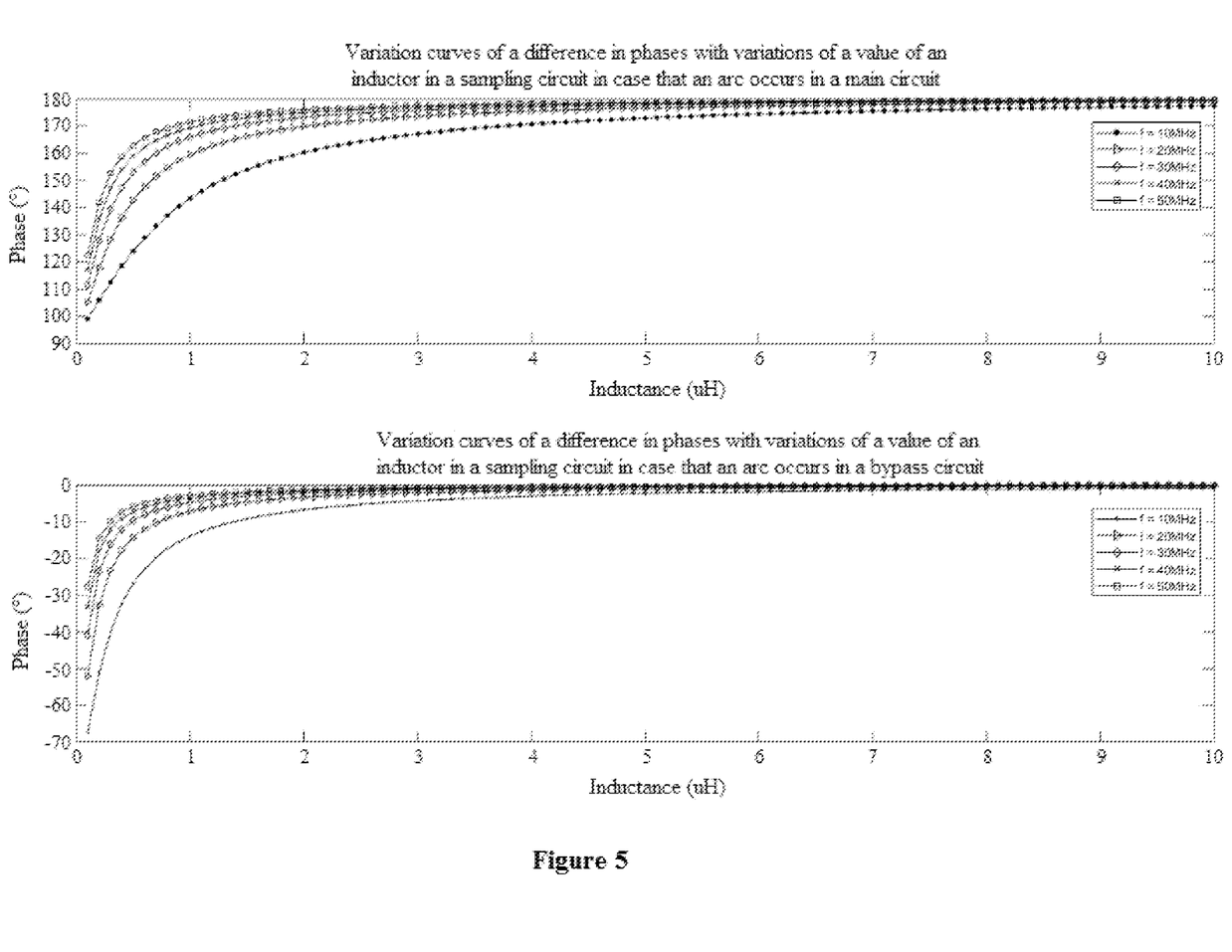
FIG. 5 shows variation curves of a difference of a phase of $\dot{U}_1$ and a phase of $\dot{U}_2$ with variations of a value of an inductor in a sampling circuit in a case that an arc occurs in a bypass circuit and variation curves of a difference of a phase of $\dot{U}_1$ and a phase of $\dot{U}_2$ with variations of a value of an inductor in a sampling circuit in a case that an arc occurs in a main circuit.

FIG. 5 shows variation curves of a difference of a phase of $\dot{U}_1$ and a phase of $\dot{U}_2$ with variations of a value of an inductor in a sampling circuit in a case that an arc occurs in a bypass circuit and variation curves of a difference of a phase of $\dot{U}_1$ and a phase of $\dot{U}_2$ with variations of a value of an inductor in a sampling circuit in a case that an arc occurs in a main circuit. Due to the impeding effect of inductive reactance (jωl) on the current, a higher frequency indicates a more obvious impeding effect. Based on the circuit parameters in the above embodiments, the difference of the phase of $\dot{U}_1$ and the phase of $\dot{U}_2$ in the case that the arc occurs in the main circuit is positive and ranges from 90° to 180°, and the difference of the phase of $\dot{U}_1$ and the phase of $\dot{U}_2$ in the case that the arc occurs in the bypass circuit is negative and ranges from −90° to 0°.

With the method for identifying an arc crosstalk signal based on vector analysis according to the present disclosure, differences in features of crosstalk signals are obtained with respect to signal amplitude and phase, thereby achieving a reliable determination result.

With a time-sharing data processing method according to the present disclosure, two signals are segmented according to time, and feature value extraction is performed on each of segments having a time period of 20 us. Effective values of the two signal sequences are extracted for indicating amplitude features of the signals in the time period, achieving a highly representative result. In the present disclosure, phase features of a signal at multiple frequency points are extracted based on the conventional digital phase-locked amplification technology. With the method according to the present disclosure, noise is greatly suppressed based on the principle that noise and a reference signal are not correlated with each other, so that amplitude and phase information of a weak signal is accurately extracted. In addition, anti-interference ability of the algorithm is enhanced based on phase features and phase fluctuation features at multiple frequency points, so that the extracted phase features are reliable. Based on a zero-crossing signal outputted by a zero-crossing detection circuit, the system obtains an amplitude ratio feature value and a phase difference feature value of a signal in each of channels within 20 ms.

BRIEF DESCRIPTION OF THE DRAWINGS

The present disclosure is further described below in combination with the accompanying drawings.

DETAILED DESCRIPTION OF THE EMBODIMENTS

Hereinafter, a method for identifying an arc crosstalk according to the present disclosure is described in combination with FIGS. 1 to 9.

Figure 1:
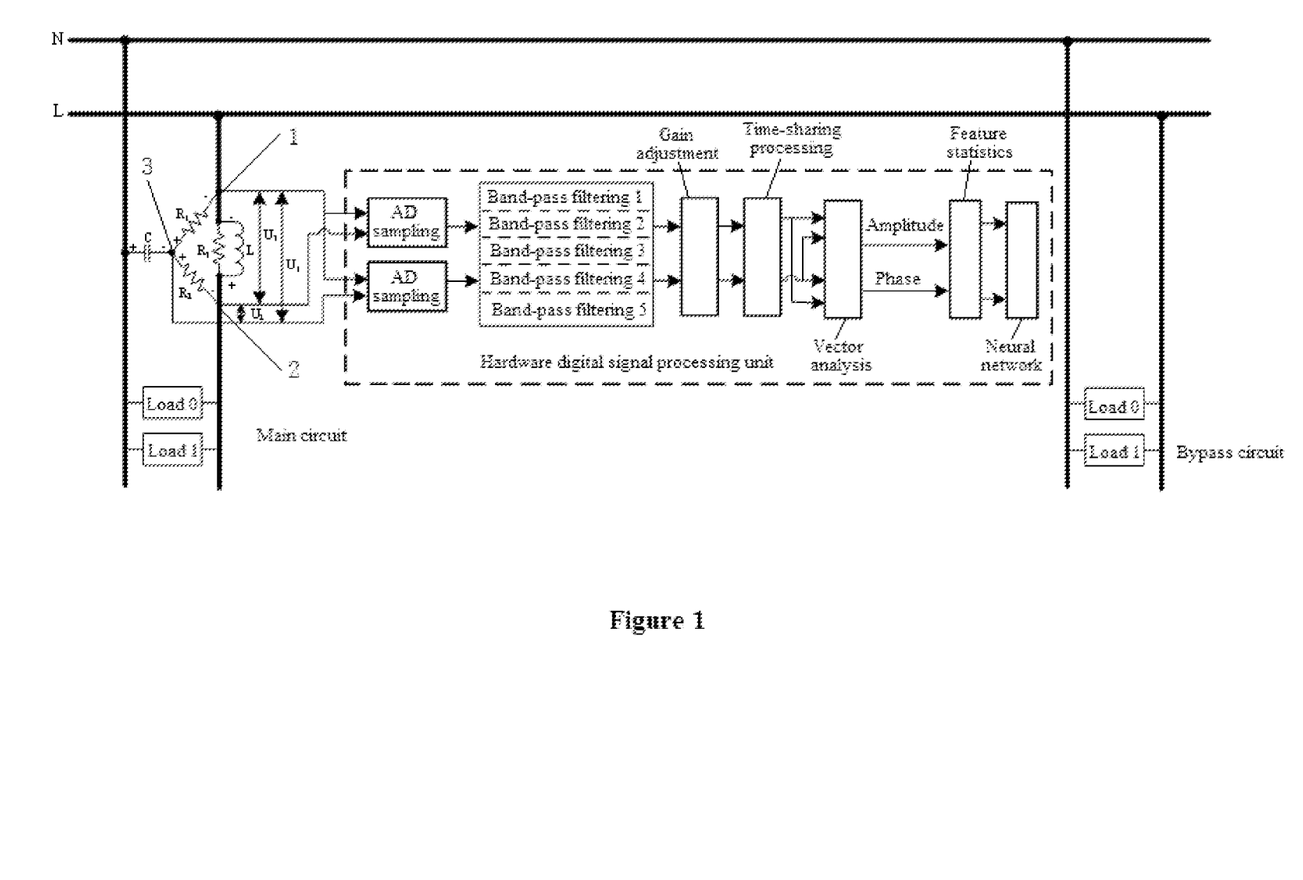
FIG. 1 shows a flow chart of a crosstalk feature extraction system according to the present disclosure.

FIG. 1 shows a process of identifying features of a crosstalk signal based on vector analysis calculation according to the present disclosure. As shown in FIG. 1, an adopted sampling circuit includes: a first resistor $R_1$, a second resistor $R_2$, a third resistor $R_3$, an inductor L and a capacitor C. The inductor L is connected in series between a first measurement point 1 and a second measurement point 2 in a live line, the third resistor $R_3$ is connected in parallel with the inductor L, the first resistor $R_1$ is connected in series between the first measuring point 1 and a third measuring point 3, the second resistor $R_2$ is connected in series between the second measuring point 2 and the third measuring point 3, the third measuring point 3 is connected to a neutral line via the capacitor C, and a load is connected between the live line and the neutral line. In performing sampling, a voltage signal of the inductor between the first measuring point 1 and the second measuring point 2 and a voltage signal of the first resistor between the first measuring point 1 and the third measuring point 3 are collected respectively to analyze whether an arc fault occurs in the sampled line. The system performs operations mainly based on processing of a hardware digital signal processing system, including the following steps 1 to 5.

In step 1, a Y-type sampling circuit according to the present disclosure is constructed, AD sampling, with a sampling rate up to 200 MHz, is performed on signals of the resistor R1 and the inductor L to obtain, then the digital signals $y_{R1}(n)$ and $y_L(n)$ are transmitted to the hardware digital signal processing system for performing vector analysis in real time, and then an amplitude ratio feature vector, an amplitude fluctuation feature vector, a phase difference feature vector and a phase fluctuation feature vector are calculated.

In step 2, the signals $y_{R1}(n)$ and $y_L(n)$ are respectively filtered by band-pass digital filters. Each of the filters may be designed as a 64-order filter. Pass frequency bands include a frequency band ranging from 5 MHz to 10 MHz, a frequency band ranging from 15 MHz to 20 MHz, a frequency band ranging from 25 MHz to 30 MHz, a frequency band ranging from 35 MHz to 40 MHz, and a frequency band ranging from 45 MHz to 50 MHz. h(n) represents a unit impulse response of a digital filter. The filtered signal is expressed as:

$$\begin{cases} y_{R1\_FIR}(n) = y_{R1}(n) * h(n) = \sum_{k=-\infty}^{+\infty} h(k) \cdot y_{R1}(n-k) \\ y_{L\_FIR}(n) = y_L(n) * h(n) = \sum_{k=-\infty}^{+\infty} h(k) \cdot y_L(n-k) \end{cases}$$

After performing filtering, adaptive gain adjustment may be performed based on the amplitude of the filtered signal, amplifying a weak arc signal, preventing a digital signal overflow, and thereby ensuring the reliability of extracting features of the arc crosstalk.

In step 3, time-sharing processing is performed on the filtered data from two channels, vector analysis is performed on the signal within every 20 us to calculate an amplitude ratio feature vector and a phase difference feature vector according to the present disclosure.

Figure 6:
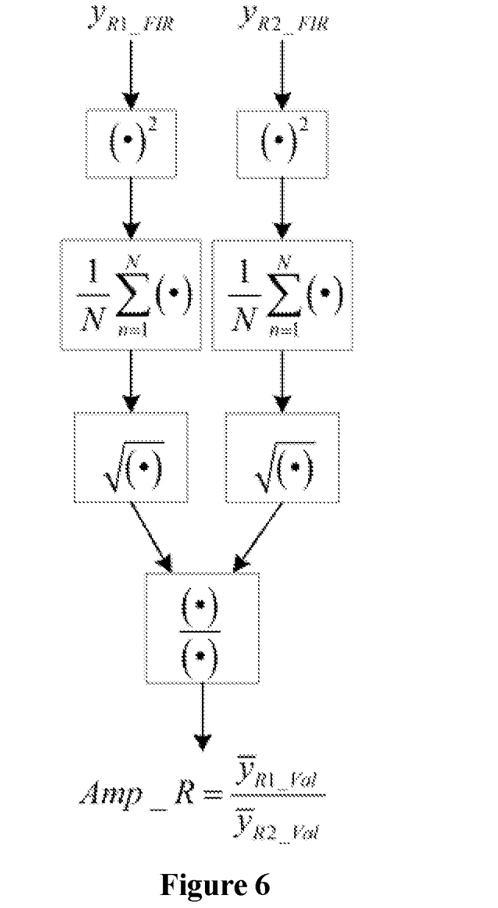
FIG. 6 is a flow chart of calculating a ratio of amplitudes according to the present disclosure.

The amplitude ratio feature vector is calculated by obtaining a ratio of effective values of amplitudes of the signals of the resistors $R_1$ and $R_2$ in each of time periods. As shown in the flow chart of the system processing in FIG. 6, signal sequences of the resistor $R_1$ and the inductor L are respectively set as:

$$\begin{cases} y_{R1\_FIR} = \{a_1, a_2, \ldots, a_N\} \\ y_{L\_FIR} = \{b_1, b_2, \ldots, b_N\} \end{cases}$$

Based on the Y-type circuit, the resistor $R_1$ resistor $R_2$, and inductor L form a closed-loop triangle. Based on a Kirchhoff's Voltage rule, a signal sequence of the resistor $R_2$ may be calculated as the following expression:

$$y_{R2\_FIR} = \{b_1-a_1, b_2-a_2, \ldots, b_N-a_N\}$$

(1) Squaring operation is respectively performed on the signal sequence of the resistor $R_1$ and on the signal sequence of the resistor $R_2$ by using the following equations:

$$\begin{cases} y_{R1\_square} = \{a_1^2, a_2^2, \ldots, a_N^2\} \\ y_{R2\_square} = \{(b_1 - a_1)^2, (b_2 - a_2)^2, \ldots, (b_N - a_N)^2\} \end{cases}$$

(2) Average operation is respectively performed on the squares of two signal sequences by using the following equations:

$$\begin{cases} \bar{y}_{R1\_square} = \dfrac{1}{N} \cdot \{a_1^2 + a_2^2 + \ldots + a_N^2\} \\ \bar{y}_{R2\_square} = \dfrac{1}{N} \cdot [(b_1 - a_1)^2 + (b_2 - a_2)^2 + \ldots + (b_N - a_N)^2] \end{cases}$$

(3) Square root operation is respectively performed on average values of sums of the squares of the two signals by using the following equations:

$$\begin{cases} \bar{y}_{R1\_Val} = \sqrt{\dfrac{1}{N} \cdot \{a_1^2 + a_2^2 + \ldots + a_N^2\}} \\ \bar{y}_{R2\_val} = \sqrt{\dfrac{1}{N} \cdot [(b_1 - a_1)^2 + (b_2 - a_2)^2 + \ldots + (b_N - a_N)^2]} \end{cases}$$

(4) A ration of amplitudes of the signals of the resistor $R_1$ and the resistor $R_2$ is calculated by using the following equation:

$$\text{Amp\_R} = \dfrac{\bar{y}_{R1\_Val}}{\bar{y}_{R2\_Val}}$$

By using the above algorithm, an amplitude ratio feature vector of a signal on each of channels, including $\text{Amp\_R}_1$, $\text{Amp\_R}_2$, $\text{Amp\_R}_3$, $\text{Amp\_R}_4$, $\text{Amp\_R}_5$, are respectively calculated.

Figure 8:
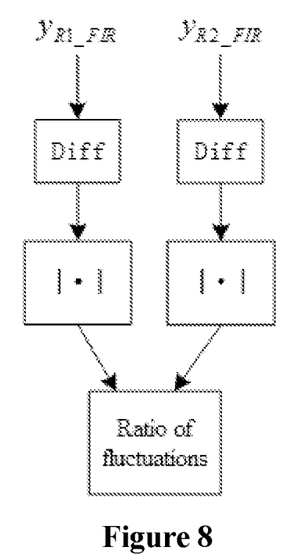
FIG. 8 shows a flow chart of calculating amplitude fluctuation according to the present disclosure.

The amplitude fluctuation difference feature vector is calculated by obtaining a ratio of absolute values of a difference between an amplitude of a signals of the resistor $R_1$ and an amplitude of a signals of the resistor $R_2$ in each of time period. As shown in the flow chart of the system processing in FIG. 8, signal sequences of the resistor $R_1$ and the inductor L are respectively set as:

$$\begin{cases} y_{R1\_FIR} = \{a_1, a_2, \ldots, a_N\} \\ y_{L\_FIR} = \{b_1, b_2, \ldots, b_N\} \end{cases}$$

Based on the Y-type circuit, the resistor $R_1$, resistor $R_2$ and inductor L form a closed-loop triangle. Based on a Kirchhoff s Voltage rule, a signal sequence of the resistor $R_2$ may be calculated as the following expression:

$$\{(b_1 - a_1), (b_2 - a_2), \ldots, (b_N - a_N)\}$$

(1) An absolute value of differences of a signal of the resistor $R_1$ and an absolute value of differences a signal of the resistor $R_2$ are respectively calculated by using the following equations:

$$\begin{cases} y_{R1\_AMP} = \{|a_2 - a_1|, |a_3 - a_2|, \ldots, |a_N - a_{N-1}|\} \\ y_{R2\_AMP} = \{|(b_2 - a_2) - (b_1 - a_1)|, |(b_3 - a_3) - (b_2 - a_2)|, \ldots, |(b_N - a_N) - (b_{N-1} - a_{N-1})|\} \end{cases}$$

(2) Statistics is performed on the amplitude of the signal of the resistor R1 and the amplitude of the signal of the resistor R2 in each of time periods. The absolute value of differences of the signal of the resistor $R_1$ and the absolute value of differences of the signal of the resistor R2 are outputted as feature vectors. For data within every 20 ms, a set of feature vectors are outputted and sent to a neural network.

Figure 9:
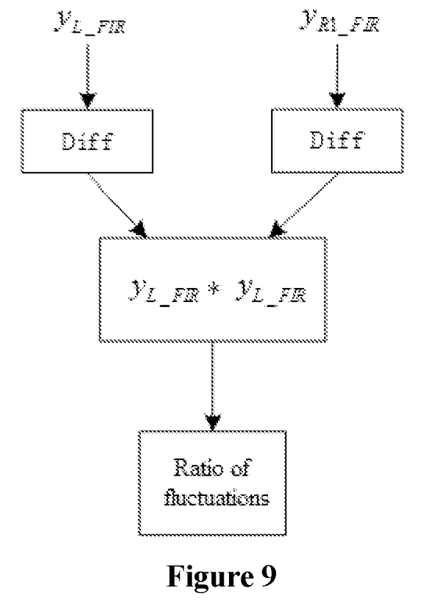
FIG. 9 shows a flow chart of calculating phase fluctuation according to the present disclosure.

The phase fluctuation feature vector is calculated by obtaining a difference between a phase of a signal of the resistor R and a phase of a signal of the inductor L in each of time periods. As shown in the flow chart of the system processing in FIG. 9, signal sequences of the resistor R and the inductor L are respectively set as:

$$\begin{cases} y_{R\_FIR} = \{a_2 - a_1, a_3 - a_2, \ldots, a_N - a_{N-1}\} \\ y_{L\_FIR} = \{b_2 - b_1, b_3 - b_2, \ldots, b_N - b_{N-1}\} \end{cases}$$

(1) A differential sequence of the signal of the resistor R and a differential sequence of the signal of the inductor L are respectively calculated by using the following equations:

$$\begin{cases} y_{R\_FIR} = \{a_2 - a_1, a_3 - a_2, \ldots, a_N - a_{N-1}\} \\ y_{L\_FIR} = \{b_2 - b_1, b_3 - b_2, \ldots, b_N - b_{N-1}\} \end{cases}$$

(2) Statistics is performed on the fluctuation of the signal of the resistor and the fluctuation of the signal of the inductor in each of time periods. A feature vector is outputted in a case that R1*L<0. For data within every 20 ms, a set of feature quantities are outputted and sent to a neural network.

Figure 7:
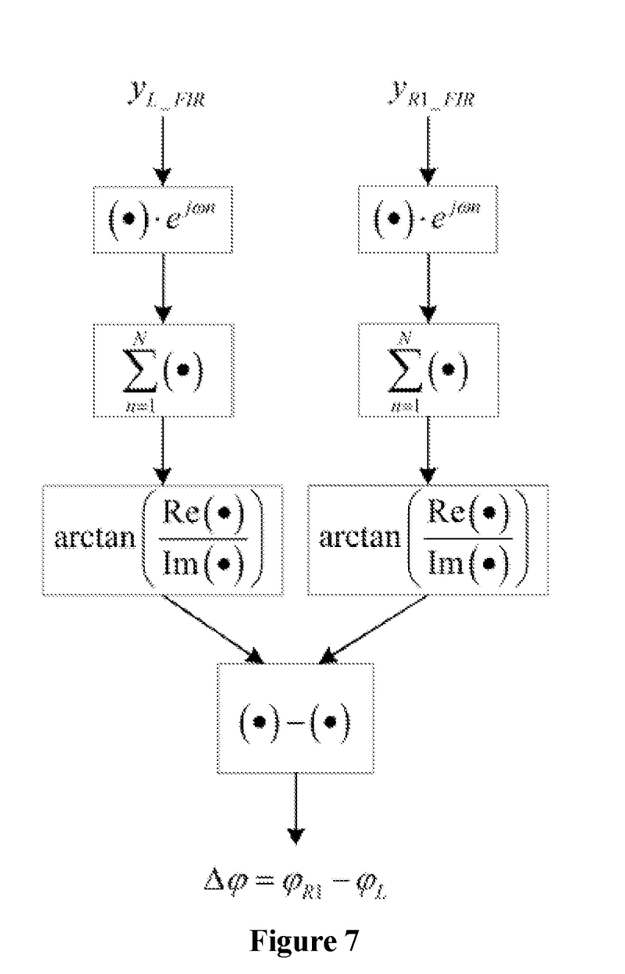
FIG. 7 shows a flow chart of calculating a difference between phases according to the present disclosure.

The phase difference feature vector is calculated by obtaining a difference between a phase of a signal of the resistor R and a phase of a signal of the inductor L in each of time periods. As shown in the flow chart of the system processing in FIG. 7, signal sequences of the resistor R and the inductor L are respectively set as:

$$\begin{cases} y_{R\_FIR} = \{a_1, a_2, \ldots, a_N\} \\ y_{L\_FIR} = \{b_1, b_2, \ldots, b_N\} \end{cases}$$

(1) A frequency $f_0$ equal to 30 Mhz in a pass frequency band of the filter is determined as a reference frequency, and a standard complex signal sequence at this frequency point is calculated and expressed as:

$$y_e\{e^{j\omega_0 1}, e^{j\omega_0 2}, \ldots, e^{j\omega_0 N}\}$$

(2) The signal sequence of the resistor $R_1$ and the signal sequence of inductor L are respectively multiplied with the standard complex signal sequence, improving the signal-to-noise ratio of the signal at the frequency to be measured, and thereby greatly improves the effect of extracting phase features of weak signals. The calculation results are as follows:

$$\begin{cases} y_{R1\_product} = \left\{a_1 \cdot e^{j\omega_0^1}, a_2 \cdot e^{j\omega_0^2}, \ldots, a_N \cdot e^{j\omega_0^N}\right\} \\ y_{L\_product} = \left\{b_1 \cdot e^{j\omega_0^1}, b_2 \cdot e^{j\omega_0^2}, \ldots, b_N \cdot e^{j\omega_0^N}\right\} \end{cases}$$

(3) Integral operation is performed on the obtained product sequence. Based on a principle of converting discrete signal integral to summation, the following integral results are obtained:

$$\begin{cases} D_1 = \sum_{n=1}^{N} a_n \cdot e^{j\omega_0^n} \\ D_2 = \sum_{n=1}^{N} b_n \cdot e^{j\omega_0^n} \end{cases}$$

(4) Based on the integral results, initial phases of the two signal sequences at the reference frequency point in the time period are calculated by using the follows equations:

$$\begin{cases} \varphi_{R1\_0} = \arctan\left(\frac{\text{Re}(D_1)}{\text{Im}(D_1)}\right) \\ \varphi_{L\_0} = \arctan\left(\frac{\text{Re}(D_2)}{\text{Im}(D_2)}\right) \end{cases}$$

(5) A difference between the initial phases is calculated to obtain the phase difference feature vector of the two signals at the frequency $f_0$ of 30 Mhz in a first vector analysis:

$$\Delta\varphi_0 = \varphi_{R1\_0} - \varphi_{L\_0}$$

(6) In the pass frequency bands, a reference frequency $f_0$ is respectively selected as $f_1$, $f_2$, $f_3$, $f_4$ and $f_5$., phase differences $\Delta\varphi_1$, $\Delta\varphi_2$, $\Delta\varphi_3$, $\Delta\varphi_4$ and $\Delta\varphi_5$, respectively corresponding to the channels, between a phase of a signal of a resistor $R_1$ and a phase of a signal of an inductor L in the time period is calculated by performing the above steps (1) to (5).

In step 4, a hardware digital signal processing unit performs vector analysis on the two sampling signals, outputs an amplitude ratio feature value, an amplitude fluctuation feature value, a phase difference feature value and a phase fluctuation feature value in real time, and then sends all the feature values to a MCU system for statistical processing.

In step 5, the system monitors a hardware zero-crossing detection circuit, statistics is performed on the amplitude ratio feature vector, the amplitude fluctuation feature vector, the phase difference feature vector and the phase fluctuation feature vector each time a zero-crossing signal arrives, and splices the feature values in a half wave to obtain a 10*500 feature matrix. Then, the feature matrix is inputted to a neural network for calculation to obtain an identification result.

Compared with the conventional devices, with which only a fault arc signal is detected and an arc in a main circuit cannot be distinguished from an arc in a bypass circuit, in the method for identifying an arc crosstalk signal according to the present disclosure, vector analysis is performed on high-frequency components of an arc signal with respect to amplitude and phase, targeted processing is performed on high-frequency features of the arc signal, accurately identifying the arc crosstalk signal, achieving strong anti-interference ability in various complex power consumption environments, and thereby achieving a stable and reliable identification result.

The embodiments described above are only preferred embodiments of the present disclosure. For those skilled in the art, several improvements and changes may be made without departing from the principle of the present disclosure. Any modification, equivalent replacement, improvement and the like made within the spirit and principle of the present disclosure should be included in the protection of the present disclosure.

The invention claimed is:

1. A method for identifying an arc crosstalk signal based on vector analysis calculation, comprising:
   performing sampling, by a sampling circuit, to obtain a voltage signal of an inductor and voltage signal of a first resistor, wherein
      the sampling circuit comprises: a first resistor $R_1$, a second resistor $R_2$, a third resistor $R_3$, an inductor L and a capacitor C;
      the inductor L is connected in series between a first measurement point and a second measurement point in a live line, the third resistor $R_3$ is connected in parallel with the inductor L, the first resistor $R_1$ is connected in series between the first measuring point and a third measuring point, the second resistor $R_2$ is connected in series between the second measuring point and the third measuring point, the third measuring point is connected to a neutral line via the capacitor C, and a load is connected between the live line and the neutral line; and
   in performing sampling, a voltage signal of the inductor between the first measuring point and the second measuring point and a voltage signal of the first resistor between the first measuring point and the third measuring point are collected respectively to analyze whether an arc fault occurs in the sampled line;
   calculating a voltage signals of a second resistor based on the voltage signal of the inductor and the voltage signal of the first resistor, determining the voltage signal of the first resistor as a first sampling signal, determining the voltage signal of the second resistor as a second sampling signal, and determining the voltage signal of the inductor as a third sampling signal; and
   determining whether a signal in a sampled line is an arc signal or a crosstalk signal based on an amplitude ratio feature vector, an amplitude fluctuation feature vector, an phase difference feature vector and/or a phase fluctuation feature vector, wherein the amplitude ratio feature vector is equal to a ratio of a voltage effective value of the first sampling signal to a voltage effective value of the second sampling signal, the amplitude fluctuation feature vector represents a magnitude relationship between a voltage amplitude fluctuation of the first sampling signal and a voltage amplitude fluctuation of the second sampling signal, the phase difference feature vector is equal to a difference between a phase of the first sampling signal and a phase of the third sampling signal, and the phase fluctuation feature vector is equal to a difference between a phase fluctuation of the first sampling signal and a phase fluctuation of the third sampling signal.

2. The method for identifying an arc crosstalk signal based on vector analysis calculation according to claim 1, wherein the determining whether a signal in a sampled line is an arc signal or a crosstalk signal based on an amplitude ratio feature vector, an amplitude fluctuation feature vector, an phase difference feature vector and a phase fluctuation feature vector comprises:
   determining, by a trained neural network model, whether the signal in the sampled line is the arc signal or the crosstalk signal based on an amplitude ratio feature vector, an amplitude fluctuation feature vector, an phase difference feature vector and a phase fluctuation feature vector.

3. The method for identifying an arc crosstalk signal based on vector analysis calculation according to claim 1, wherein before determining whether the signal in the sampled line is the arc signal or the crosstalk signal, the method further comprises:
- performing analog-to-digital conversion on the voltage signal of the inductor and the voltage signal of the first resistor;
- filtering, by several band-pass digital filters, the voltage signal of the inductor after analog-to-digital conversion and the voltage signal of the first resistor after analog-to-digital conversion; and
- performing adaptive gain adjustment on the filtered voltage signal of the inductor and the filtered voltage signal of the first resistor based on amplitudes of the filtered voltage signal of the inductor and the filtered voltage signal of the first resistor, wherein a gain multiple for the voltage signal of the inductor in a frequency band is same as a gain multiple for the voltage signal of the first resistor in the frequency band.

4. The method for identifying an arc crosstalk signal based on vector analysis calculation according to claim 1, wherein the determining whether a signal in a sampled line is an arc signal or a crosstalk signal based on an amplitude ratio feature vector comprises:
- determining that the signal in the sampled line is the arc signal in a case that the ratio of the voltage effective value of the first sampling signal to the voltage effective value of the second sampling signal is less than a predetermined threshold, and
- determining that the signal in the sampled line is the crosstalk signal in a case that the ratio of the voltage effective value of the first sampling signal to the voltage effective value of the second sampling signal is greater than a predetermined threshold.

5. The method for identifying an arc crosstalk signal based on vector analysis calculation according to claim 1, wherein the determining whether a signal in a sampled line is an arc signal or a crosstalk signal based on an amplitude fluctuation feature vector comprises:
- determining that the signal in the sampled line is the arc signal in a case that the voltage amplitude fluctuation of the first sampling signal is less than the voltage amplitude fluctuation of the second sampling signal, and
- determining that the signal in the sampled line is the crosstalk signal in a case that the voltage amplitude fluctuation of the first sampling signal is greater than the voltage amplitude fluctuation of the second sampling signal.

6. The method for identifying an arc crosstalk signal based on vector analysis calculation according to claim 1, wherein the determining whether a signal in a sampled line is an arc signal or a crosstalk signal based on a phase difference feature vector comprises:
- determining that the signal in the sampled line is the arc signal in a case that the difference between the phase of the first sampling signal and the phase of the third sampling signal is greater than 0° and ranges from 0° to 180°, and
- determining that the signal in the sampled line is the crosstalk signal in a case that the difference between the phase of the first sampling signal and the phase of the third sampling signal is less than 0° and ranges from −90° to 0°.

7. The method for identifying an arc crosstalk signal based on vector analysis calculation according to claim 1, wherein the determining whether a signal in a sampled line is an arc signal or a crosstalk signal based on the phase fluctuation feature vector comprises:
- determining that the signal in the sampled line is the arc signal in a case that the phase of the first sampling signal is ahead of the phase of the third sampling signal, and
- determining that the signal in the sampled line is the crosstalk signal in a case that the phase of the first sampling signal lags behind the phase of the third sampling signal.

* * * * *